United States Patent [19]

De

[11] Patent Number: 5,841,299

[45] Date of Patent: Nov. 24, 1998

[54] METHOD AND APPARATUS FOR IMPLEMENTING AN ADIABATIC LOGIC FAMILY

[75] Inventor: Vivek K. De, Hillsboro, Oreg.

[73] Assignee: Intel Corporation, Santa Clara, Calif.

[21] Appl. No.: 795,652

[22] Filed: Feb. 6, 1997

[51] Int. Cl.$^6$ .................. H03K 19/00; H03K 19/0175
[52] U.S. Cl. .......................... 326/98; 326/83; 326/87
[58] Field of Search .................. 326/93, 95–98, 326/121, 112, 119, 83, 85; 327/544, 546

[56] References Cited

U.S. PATENT DOCUMENTS

| | | |
|---|---|---|
| 5,378,940 | 1/1995 | Knight, Jr. et al. . |
| 5,396,527 | 3/1995 | Schlecht et al. . |
| 5,521,538 | 5/1996 | Dickinson .................. 326/93 |
| 5,568,069 | 10/1996 | Chow .................. 326/113 |
| 5,670,899 | 9/1997 | Kohdaka .................. 326/97 |
| 5,675,263 | 10/1997 | Gabara .................. 326/97 |
| 5,701,093 | 12/1997 | Suzuki .................. 362/98 |

OTHER PUBLICATIONS

Younis, S.C., "Asymptotically Zero Energy Computing Using Split–Level Charge Recovery Logic", Thesis submitted in partial fulfillment for Doctor of Philosophy at MIT. Jun. 1994.

Koller, J.G., "Adiabatic Switching, Low Energy Computing and the Physics of Computation", Proceedings of Workshop on Physics of Storing and Erasing Information, Oct. 1992, IEEE Press pp. 1–7.

J.B. Burr, "Cryogenic Ultra Low Power CMOS," 1995 Symp. on Low–Power Electronics: Dig. of Tech. Papers, pp. 82–83, Oct. 1995.

M. Nandakumar et al., "A Device Design Study of 0.25 μm Gate Length CMOS for IV Low Power Applications," 1995 Symp. on Low–Power Electronics: Dig. of Tech. Papers, pp. 80–81, Oct. 1995.

A.P. Chandrakasan et al., "Low Power CMOS Digital Design," IEEE J. Solid–State Circuits, 27(4), pp. 473–484, Apr. 1992.

AP Chandrakasan et al., "A Low–Power Chipset for Portable Multimedia Applications," ISCC: Dig. Tech. Papers, pp. 82–83, Feb. 1994.

D. Maksimovic, "A MOS Gate Drive with Resonant Transitions," Proc. IEEE Power Electronics Specialists Conference, pp. 527–532, 1991.

T. Indermaur and M. Horowitz, "Evaluation of Charge Recovery Circuits and Adiabatic Switching for Low Power CMOS Design," 1994 Symp. on Low–Power Electronics: Dig. of Tech Papers, pp. 102–103, Oct. 1994.

(List continued on next page.)

Primary Examiner—Jon Santamauro
Assistant Examiner—Don Phu Le
Attorney, Agent, or Firm—Blakely, Sokoloff, Taylor & Zafman

[57] ABSTRACT

A low power-dissipation gate for use in a logic cascade is described. The gate includes a pull-up switch arrangement, a pull-down switch arrangement and hold circuitry for holding an output of the gate while it is evaluated by a downstream gate. The gate is coupled between a pair of power rails which carry power clock waveforms which are approximately 180 degrees out-of-phase with each other. The gate is also coupled to receive a logic input signal, and a logic complement input signal. The transitions of the logic complement input signal are delayed by a pre-determined amount relative to transitions of the logic input signal. Each of the pull-up and pull-down switch arrangements have both P-type and N-type switching devices, and are distinguished in that the P-type switching devices of the pull-up switch arrangement are coupled to receive the input signal, while the P-type switching devices of the pull-down switch arrangement are coupled to receive the input complement signal. Similarly, the N-type switching devices of the pull-up switch arrangement are coupled to receive the input complement signal, while the N-type switching devices of the pull-down switch arrangement are coupled to receive the input signal.

26 Claims, 6 Drawing Sheets

OTHER PUBLICATIONS

SG Younis and TF Knight, Jr., "Non–Dissipative Rail Drivers for Adiabatic Circuits," Proc. 1995 Chapel Hill Conference on VLSI, pp. 404–414, 1995.

RT Hinman and MF Schlecht, "Recovered Energy Logic—A Highly Efficient Alternative to Today's Logic Circuits," IEEE Power Electronics Specialists' Conference Record, pp. 17–26, 1993.

RT Hinman and MF Schlecht, "Power Dissipation Measurements in Recovered Energy Logic," 1994 Symp. on VLSI Circuits: Dig. Tech. Papers, 1994.

A. Kramer et al., "Adiabatic Computing with 2N–2N2D Logic Family, 1994 Symp. on VLSI Circuits: Dig. Tech. Papers, 1994.

SG Younis and TF Knight, Jr., "Practical Implementations of Charge Recovering Asymptomatically Zero Power CMOS," Proc. of the 1993 Symp. on Integrated Systems, pp. 234–250, 1993.

Y. Moon and DK Jeong, "Efficient charge Recovery Logic," 1995 Symp. on VLSI circuits: Dig. Tech. Papers, pp. 129–130, 1995.

WC Athas et al., "Low–power Digital Systems based on Adiabatic–Switching Principles," IEEE Trans. Very Large Scale Integration (VLSI) Systems, vol. 2(4), pp. 398–406, 1994.

J.S. Denker, "A Review of Adiabatic Computing," 1994 IEEE Symp. of Low Power Electronics Dig. of Tech Papers, Oct. 1994.

CL Seitz et al., "Hot–Clock nMOS" 1985 Chapel Hill Conference on VLSI, pp. 1–17, 1985.

T. Gabara, "Pulsed Power Supply CMOS—PPS–Model," 1994 IEEE Symposium.

V.K. De and J.D. Meindl, "Complementary Adiabatic and Fully Adiabatic MOS Logic Families for Gigascale Integration", ISSCC: Dig. of Tech. Papers, pp. 298–299, Feb., 1996.

J. Lotz et al., "A Quad–Issue Out–of–Order RISC CPU," ISSCC: Dig. of Tech. Papers, pp. 210–211, Feb., 1996.

METHOD AND APPARATUS FOR IMPLEMENTING AN ADIABATIC LOGIC FAMILY

FIELD OF THE INVENTION

The present invention pertains to the field of low-power logic circuitry. More particularly, the present invention relates to a method and apparatus for implementing an adiabatic logic family.

BACKGROUND OF THE INVENTION

As operating frequencies and circuit densities have increased, energy dissipation and power flux have become problematic in a wide variety of digital devices, ranging from small portable systems, (e.g. laptops and Personal Digital Assistants), where battery size, weight and operational life are critical, to large computing machines where cooling and power supply pose substantial packaging problems. Power consumption and dissipation within digital electronic devices is largely attributable to switching activities occurring within components of such devices. In conventional Complementary Metal-Oxide Semiconductor (CMOS) switches, dissipation is primarily attributable to the transfer of charge from a voltage source to a gate capacitance through a switching device which is resistive. By way of explanation, reference is made FIG. 1 which shows a simple CMOS inverter circuit 10. A logic input 12 is provided to the gate terminals on a P-channel MOS (pMOS) switch 14 and N-channel MOS (nMOS) switch 16, the drain terminals of the pMOS and nMOS switches being coupled to the node 18. A capacitor 20 is coupled between the node 18 and ground. As will be appreciated, when the input 12 is driven low, the pMOS 14 switches on, thus causing the capacitor 20 to be charged from the voltage source $V_{cc}$ through the pMOS switch 14, and a logical one (HIGH) is registered at node 18. Similarly, when the input 12 is driven high, the pMOS switch 14 switches off, and the nMOS switch 16 switches on, thus allowing charge stored in the capacitor 20 to be transferred via the nMOS switch 16 to ground, whereafter a logical zero (0) is registered at node 18. Each transition of the input signal 12 results in the transfer of a certain amount of charge across one of the switches 14 or 16. In conventional CMOS switches, such as those shown in FIG. 1, each transfer of charge is coupled with the dissipation of a certain amount of energy, which is approximately $\frac{1}{2}CV_{cc}^2$. A number of methods of reducing this quantity of energy dissipation have been proposed, including reducing the operating voltage $V_{cc}$, reducing the capacitance C, and reducing the number of switching operations which occur within an integrated circuit.

Recently, the concept of adiabatic circuits has been proposed as a method of reducing energy dissipation. Simply stated, adiabatic computing seeks to avoid the occurrence of a sudden and large potential difference across a switch when that switch is closed, and in this way to limit power dissipation. As the power dissipated across a resistive device, such as a switch, is equal to $I^2R$, by controlling the rate at which charge traverses the switch (i.e. the current), it is possible to limit the energy dissipated. Accordingly, adiabatic circuits strive to:

(1) only close a switch when the potential difference across the switch is zero (or at least at a minimum); and
(2) slowly increase, or ramp, a voltage source from which charge is transferred across the switch. It will be appreciated that the slower the rate of increase of the voltage, the slower the rate at which the charge will traverse the switch, and the less the energy dissipated.

The challenge facing the designers of adiabatic circuit is the implementation of large logic blocks using gates which maximize the number of times switches are closed with zero, or minimal, potential differences across the switches. A number of circuits and methodologies of implementing adiabatic circuits have been disclosed in the prior art. However, these circuits have included large numbers of switching devices, as well as large numbers of power clock inputs.

SUMMARY OF THE INVENTION

According to a first aspect of the invention there is provided a lower power dissipation gate for use in a logic cascade. The gate includes a pull-up switch arrangement, which outputs a first logic signal (which is a function of the pull-up switch arrangement). The pull-up switch arrangement, in turn, includes a first P-type switching device, such a pMOS switch, and a first N-type switching device, such as a nMOS switch. The first P-type switching device is coupled to receive a first input signal and the first N-type switching device is coupled to receive a second input signal which is the complement of the first input signal. Further, both the first P- and N-type switching devices are coupled to receive a first power clock waveform. The gate also includes a pull-down switch arrangement which outputs a second logic signal (which is a function of the pull-down switch arrangement). The pull-down switch arrangement includes a second N-type switching device and a second P-type switching device, the second N-type switching device being coupled to receive the first input signal and the second P-type device being coupled to receive the second input signal. Both the second N- and P-type switching devices are coupled to receive a second power clock waveform.

The gate also includes hold circuitry coupled to receive the first and second logic signals outputted from the pull-up and pull-down switch arrangements respectively, and to hold and output one of the first or second logic signals to a downstream gate. In one embodiment, the hold circuitry may comprise first and second diodes coupled between outputs of the pull-up and pull-down switch arrangements. Specifically, the first diode may be a P-type switching device, and the second diode may be a N-type switching device.

The first and second power clock waveforms are out-of-phase by approximately 180 degrees. A transition of the first input signal is also out-of-phase with a transition of the second input signal by a predetermined amount, for example, by one quarter of a cycle of the first power clock waveform.

In various embodiments of the invention, the pull-up switch arrangement may comprise an inverter, a NAND circuit, or a NOR circuit.

According to a second aspect of the invention there is provided a circuit arrangement for use in a cascade of logic stages. The circuit arrangement receives power from first and second power rails which respectively carrying first and second power clock waveforms. The circuit arrangement further includes a first gate which provides a first output signal in response to an input signal, the first gate including a first arrangement of pull-up switches and a first arrangement of pull-down switches. The first arrangement of pull-up switches is coupled to the first power rail to receive the first power clock waveform, and the first arrangement of pull-down switches is coupled to the second power rail to receive the second power clock waveform.

The circuit arrangement also includes a second gate which provides a second output in response to the first output of the first gate. The second gate includes a second arrangement of pull-up switches and a second arrangement of pull-down switches. The second arrangement of pull-up switches is coupled to the second power rail to receive the second power clock waveform, and the second arrangement of pull-down switches is coupled to the first power rail to receive the first power clock waveform.

The circuit arrangement may also include a third gate arrangement which provides a third output signal which is the complement of the first output signal. The second gate may be coupled to receive the first and third outputs from the first and third gates respectively. The circuit arrangement may also include third and fourth power rails for carrying third and fourth power clock waveforms, in which case the third gate may be coupled between the third and fourth power rails. In one embodiment, the third power clock waveform is out-of-phase with the first power clock waveform. The third and fourth power clock waveforms may be approximately 180 degrees out-of-phase.

The first arrangement of pull-up switches may comprise a first P-type switching device coupled to receive a first input signal and a first N-type switching device coupled to receive a second input signal, wherein the second input signal is the complement of the first input signal. Similarly, the first arrangement of pull-down switches may comprise a second P-type switching device coupled to receive the second input signal and a second N-type switching device coupled to receive the first input signal.

The second arrangement of pull-up switches may comprise a third P-type switching device coupled to receive the first output signal from the first gate and a third N-type switching device coupled to receive the third output signal from the third gate. Similarly, the second arrangement of pull-down switches may comprise a fourth P-type switching device coupled to receive the third output signal from the third gate and a fourth N-type switching device coupled to receive the first output signal from the first gate.

According to a third aspect of the invention there is provided a method of switching a gate in a logic cascade, wherein the gate includes a pull-switch arrangement configured to output a first logic signal. The method requires supplying a first power clock waveform, a first input signal and a second input signal to the pull-up switch arrangement, wherein the second input signal is the complement of the first input signal. A P-type switching device is switched within the pull-up switch arrangement responsive to the first input signal and the first power clock waveform, and a N-type switching device is similarly switched within the pull-up switch arrangement responsive to the second input signal and the first power clock waveform.

The method includes the further steps of supplying a second power clock waveform, the first input signal and the second input signal to a pull-down switch arrangement within the gate. A P-type switching device is switched within the pull-down switch arrangement responsive to the second input signal and the second power clock waveform. A N-type switching device is switched within the pull-up switch arrangement responsive to the first input signal and the second power clock waveform.

Respective transitions of the first and second input signals are out-of-phase by a predetermined amount. Specifically, a transition of the second input signal may be delayed relative to a transition of the first input signal by the predetermined amount such as, in one embodiment, one quarter of a cycle of the first power clock waveform.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

An apparatus and method for implementing an adiabatic logic family are described. In the following description, for purposes of explanation, numerous specific details are set forth in order to provide a thorough understanding of the present invention. It will be evident, however, to one skilled in the art that the present invention may be practiced without these specific details.

Figure 1:
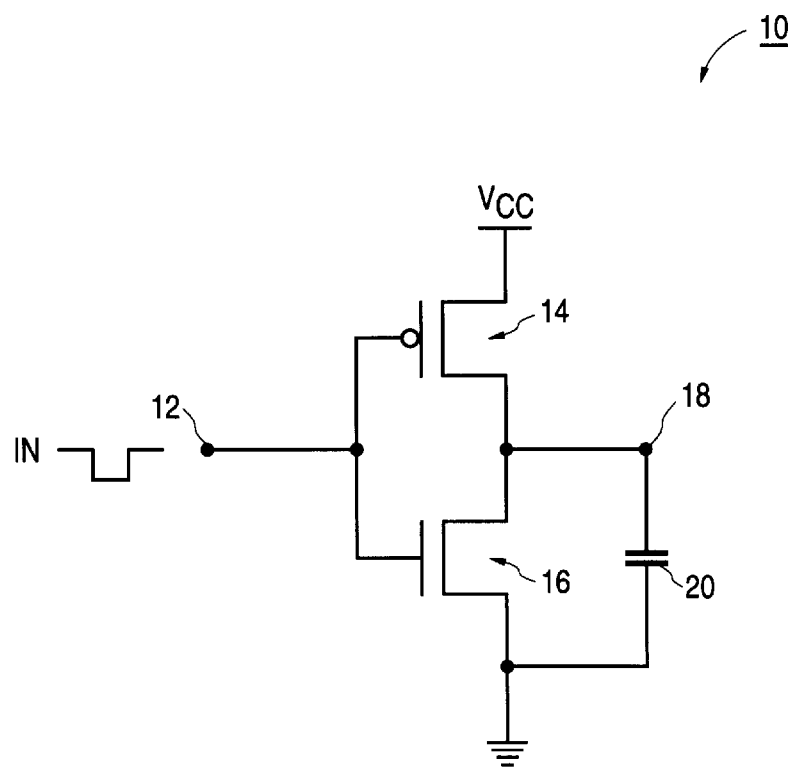
FIG. 1 is a circuit diagram showing a conventional CMOS inverter circuit.
Figure 2:
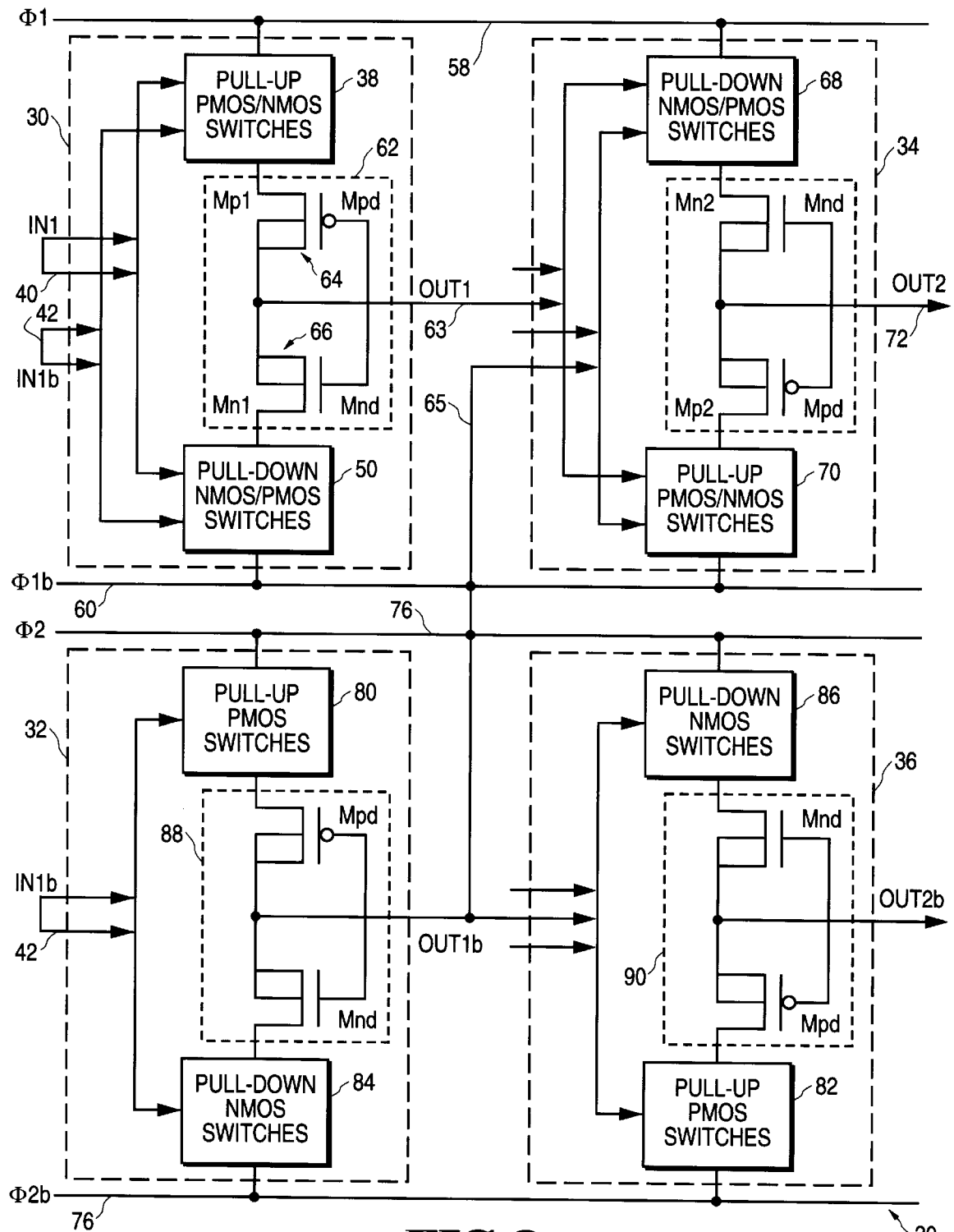
FIG. 2 is circuit diagram illustrating a cascade of logic stages comprising one embodiment of an adiabatic circuit according to the invention, wherein each stage comprises an associated pair of gates.

Referring firstly to FIG. 2, there is shown a cascade of adiabatic logic stages, designated generally by reference numeral 30, comprising gates 30, 32, 34, and 36. The gates are arranged in stages of pairs of associated primary and secondary gates, the primary gate 30 and the secondary gate 32 comprising a first associated pair of gates, and the primary gate 34 and the secondary gate 36 comprising a second pair of associated gates. Each pair of associated gates is characterized in that the outputs of the individual gates are complementary. For example, the output of the secondary gate 32 is the complement of the output of the primary gate 32. The primary gates 30 and 34 are differentiated, inter alia, from the secondary gates 32 and 36 in that they are coupled to receive both an input and an input complement from a preceding logic stage.

Each of the gates 30, 32, 34 and 36 comprises an arrangement of pull-up switches, and arrangement of pull-down switches and circuitry for holding, or maintaining, an output of one of these arrangements of switches. Each gate 30, 32, 34 and 36 is further more coupled to receive at least a single input (depending on the logic functions performed by the arrangements of pull-up and pull-down switches) and to output at least a single output signal, which may in turn comprise an input to a downstream gate. Each gate 30, 32, 43 and 36 is also coupled between two power rails, which carry power clock waveforms. Specifically, the primary gates 30 and 34 are coupled between power rails 58 and 60 which respectively carry a first power clock waveform Ø1 and a second power clock waveform Ø1b, which is approximately 180 degrees out-of-phase with the waveform Ø1. The secondary gates 32 and 36 are coupled between power rails 74 and 76 which respectively carry a third power clock waveform Ø2 and a fourth power clock waveform Ø2b, which is approximately 180 degrees out-of-phase with the wave form Ø2.

Figure 4:
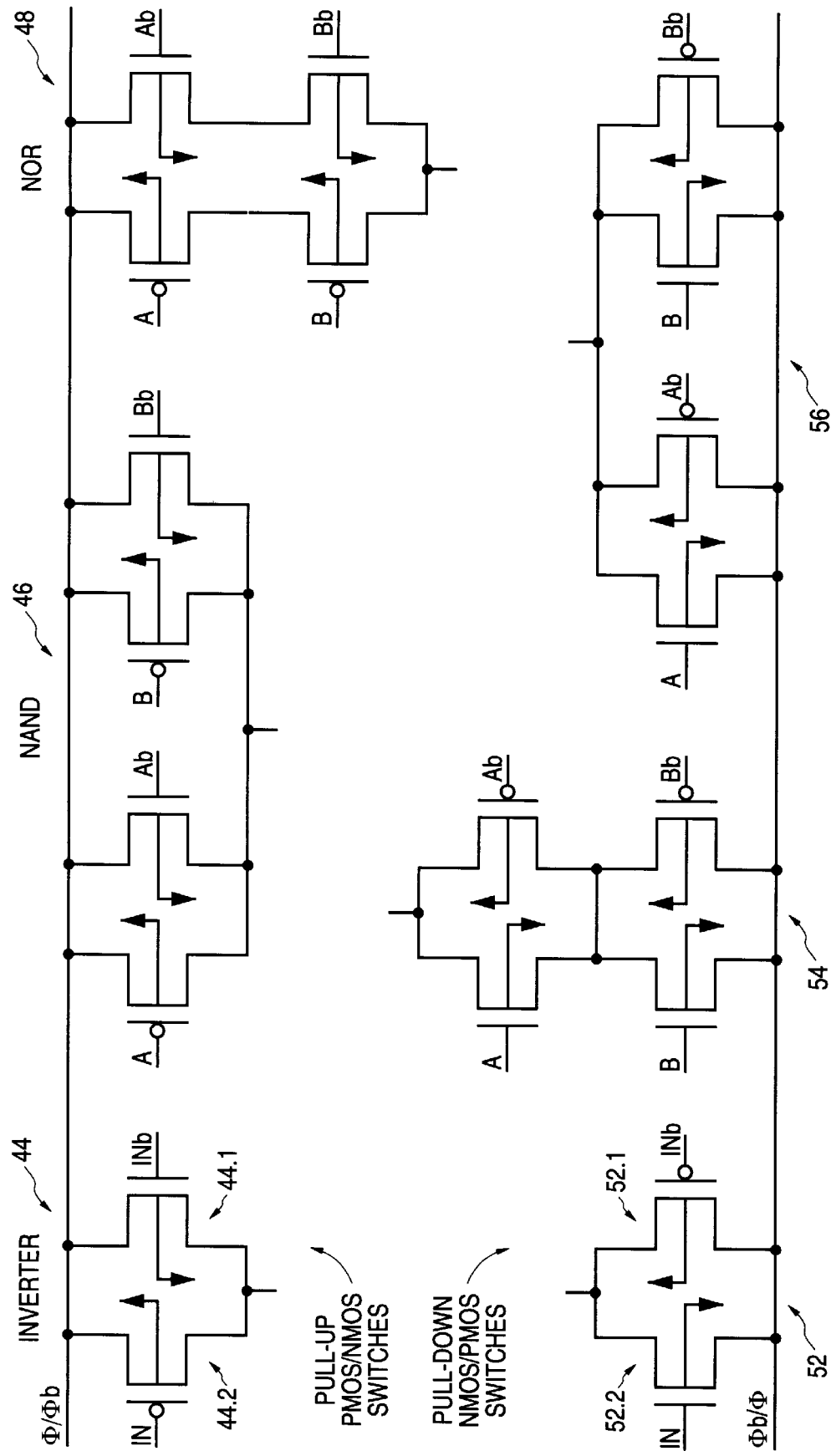
FIG. 4 illustrates a number of exemplary pull-up and pull-down switch arrangements which may be used in the adiabatic circuit shown in FIG. 2.

A description of the structure of each of the gates 30–36 will now be provided. The gate 30 comprises an arrangement of pull-up switches 38, each of the switches comprising the arrangement 38 being either a P-type switching device or a N-type switching device. In one embodiment, each P-type switching device is a pMOS switch and each N-type switching device is a nMOS switch. The arrangement of the pull-up switches 38 is configured to perform a logic function (e.g. inversion, NAND or NOR functions) and to output a logic signal in response to an input 40 and an input complement 42, which is the complement of the input 40. The arrangement of the pull-up switches 38 may be configured, according to well-known CMOS techniques, to perform a desired logic function. Referring now to FIG. 4, examples of pMOS and nMOS switch configurations, which may be used to construct the arrangement of pull-up switches 38, are illustrated at 44, 46 and 48. Specifically, the pMOS and nMOS switches could be configured to implement the inverter 44, the NAND switch 46 or the NOR switch 48. The inverter 44 is shown to comprise a nMOS switch 44.1 and a pMOS switch 44.2. In each of the arrangements of pull-up switches 44, 46 and 48, the pMOS switches are coupled to receive the input 40, and the nMOS switches are coupled to receive the input complement 42. In the case of the NAND switch 46 and the NOR switch 48, the input 40 comprises two inputs, namely inputs A and B, and the input complement 42 comprises the complements of the inputs A and B. It will readily be appreciated that, by utilizing various combinations of the switch arrangements 44–48, it is possible to implement any logic function within an arrangement of switches 38 to provides a predetermined logic output in response to the input 40 and the input complement 42.

The gate 30 further comprises an arrangement of pull-down switches 50, which is also coupled to receive the input 40 and the input complement 42. The arrangement of pull-down switches 50 may comprise any of the pull-down switch arrangements 52, 54 or 56 shown in FIG. 4, or any combination of these switch arrangements, so as to output a desired logic signal in response to the input 40 and the input complement 42. Each switch within the arrangement of pull-down switches 50 is either a P-type switching device or a N-type switching device. In an exemplary embodiment, each P-type switching device is a pMOS switch, and each N-type switching device is a nMOS switch. The inverter 52 is shown to comprise a pMOS switch 52.1 and a nMOS switch 52.2. The arrangement of pull-down switches 50 is differentiated from the arrangement of pull-up switches 38 in that each nMOS switch is coupled to receive the input 40, and each pMOS switch is coupled to receive the input complement 42.

Figure 3:
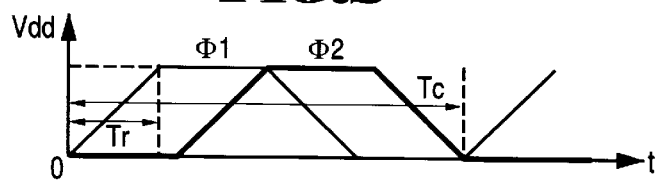
FIG. 3 shows waveforms of exemplary power clocks for use in the adiabatic circuit illustrated in FIG. 2.

The arrangement of pull-up switches 38 is coupled to a power rail 58 which carries the first power clock waveform Ø1, while the arrangement of pull-down switches 50 is coupled to the power rail 60, which carries the power clock waveform Ø1b. In one embodiment of the invention, the power clock waveforms Ø1 and Ø1b are approximately 180 degrees out-of-phase, as is described below with reference to FIG. 5. Examples of how individual switches within each of the arrangements 38 and 50 may be coupled to receive the power clock waveforms Ø1 and Ø1b are illustrated in FIG. 4. Referring to FIG. 3, an exemplary waveform Ø1 is illustrated, in which the power clock waveform Ø1 has a rise time of $T_r$, in which it ramps from 0 V to $V_{dd}$. The waveform Ø1 then is held at $V_{dd}$ for a predetermined time, before again linearly ramping down from the $V_{dd}$ to 0 V. While the power clock waveform Ø1 is shown to ramp up and down in a linear fashion in FIG. 3, the waveform Ø1 could also assume any other waveform shape, and the trapezoidal waveform shown in FIG. 3 should be regarded only as an illustrative example. In one embodiment, a high-efficiency capacitive power supply technique for the generation of a staircase power clock waveform from multiple DC sources may be used to approximate a linear ramp power clock waveform. In another embodiment, a more efficient inductive power supply technique that generates a sinusoidal dual-phase power clock waveform from a single Direct Current (DC) source and whose frequency is insensitive to the logic state of a chip may be more suitable for maximizing energy efficiency.

The respective outputs of the arrangements 38 and 50 of pull-up and pull-down switches are fed to hold circuitry 62, which is configured to hold and maintain an output of the gate 30 to the downstream gate 34, as will described below. In one embodiment, the hold circuitry 62 comprises a pair of diodes 64 and 66 in which the diode 64 is a pMOS transistor switch and the diode 66 is a nMOS transistor switch. The diodes 64 and 66 are furthermore body connected (i.e. the bodies are coupled to the drains of the transistors) to facilitate a reduction in energy dissipation across these devices. Specifically, when the output 63 is being pulled up or down through the diodes 64 or 66, the energy dissipated in such a diode is proportional to the potential drop across the diode. This potential drop is proportional to the threshold voltage of the MOSFET used to implement the diode. By connecting the body to the drain, the reverse source-to-body bias of the MOSFET is limited to approximately its threshold voltage. Larger amounts of reverse source-to-body bias, expected when the body is connected to $V_{cc}$ (for pMOS) and ground (for nMOS), increase the MOS threshold voltage, and thus the energy dissipation within the diode.

The construction of the diodes 64 and 66 may require a Triple-Tub CMOS (TRIMOS) process, which is a modification of the twin-tub bulk CMOS process.

The primary gate 34 is essentially identical in structure to the primary gate 30, but differs in the manner by which it is coupled between the power rails 58 and 60. Specifically, an arrangement of pull-down switches 68 is coupled to the power rail 58 and an arrangement of pull-up switches 70 is coupled to the power rail 60. As such, the primary gate 34 can be viewed as an "inverted" version of the preceding primary gate 30. Further, the primary gate 34 is coupled to receive the output 63 of the primary gate 30, and also the output complement 65 of the output 63 (from the secondary gate 32), as inputs. The gate 34 produces an output 72, which may be propagated further to downstream gates (not shown). In this case, any further downstream gates would follow the pattern established by the primary gates of 30 and 34 of having alternating "inverted" gates, which together comprise the cascade of gates.

The secondary gates 32 and 36 are coupled between the pair of power rails 74 and 76, which carry power clock waveforms Ø2 and Ø2b respectively. In one embodiment, the power clock waveforms Ø2 and Ø2b are 180 degrees out-of-phase. The clock form Ø2 may be similar in form to the power clock waveform Ø1 and, as shown in FIG. 3, out-of-phase with respect to the power clock waveform of Ø1 by a predetermined amount. In one embodiment, the power clock waveforms Ø1 and Ø2 are out-of-phase by one quarter of a clock cycle, as shown in FIG. 3. The difference in phase between the waveforms Ø1 and Ø2 further results in the outputs of the secondary gates 32 and 36 being out-of-phase with, or lagging, the outputs of the associated primary gates 30 and 34, as is described in more detail below with reference to FIG. 5.

Each of the secondary gates 32 and 36 includes an arrangement of pull-up switches 80 or 82, an arrangement of pull-down switches 84 or 86, and hold circuitry 88 or 90 for maintaining or holding an output signal of one of the switch arrangements. However, the secondary gates 32 and 36 differ from the primary gates 30 and 34 in that the arrangement of pull-up switches 80 or 82 of each secondary gate comprises only P-type switching devices, and the arrangement of pull-down switches 84 or 86 comprises only N-type switching devices. In one embodiment, the P-type switching devices are pMOS switches, and the N-type switching devices are nMOS switches. Further, each arrangement of switches 80–86 may be configured to perform any one of a number of conventional logic functions (e.g. inversion, NAND, NOR functions). The arrangements of switches 80 and 84 are configured to perform the same logic functions as the arrangements of switches 38 and 50 of the associated primary gate 30, as the output of the gate 32 is required to be the complement of the output of the primary gate 30. Each switch within each of the arrangements of switches 80 and 84 is coupled to receive only the input complement 42, and each switch within the arrangements of switches 82 and 86 is similarly coupled to receive the output of the secondary gate 32 (i.e. the complement of the output of the primary gate 30). As in the illustrated embodiment, the holding circuitries 88 and 90 of the gates 32 and 36 may be identical in construction to the holding circuitries of the gates 30 and 34.

In the illustrated embodiment, the secondary gates 32 and 36 are of identical structure, but are arranged in an alternating "inverse" fashion. Specifically, the arrangement of pull-up switches 80 of the gate 32 is coupled to the power rail 74, while the arrangement of pull-up switches 82 of the gate 36 is coupled to the power rail 76. Similarly, the arrangement of pull-down switches 84 is coupled to the power rail 76, while the arrangement of pull-down switches 86 is coupled to the power rail 74.

Figure 5:
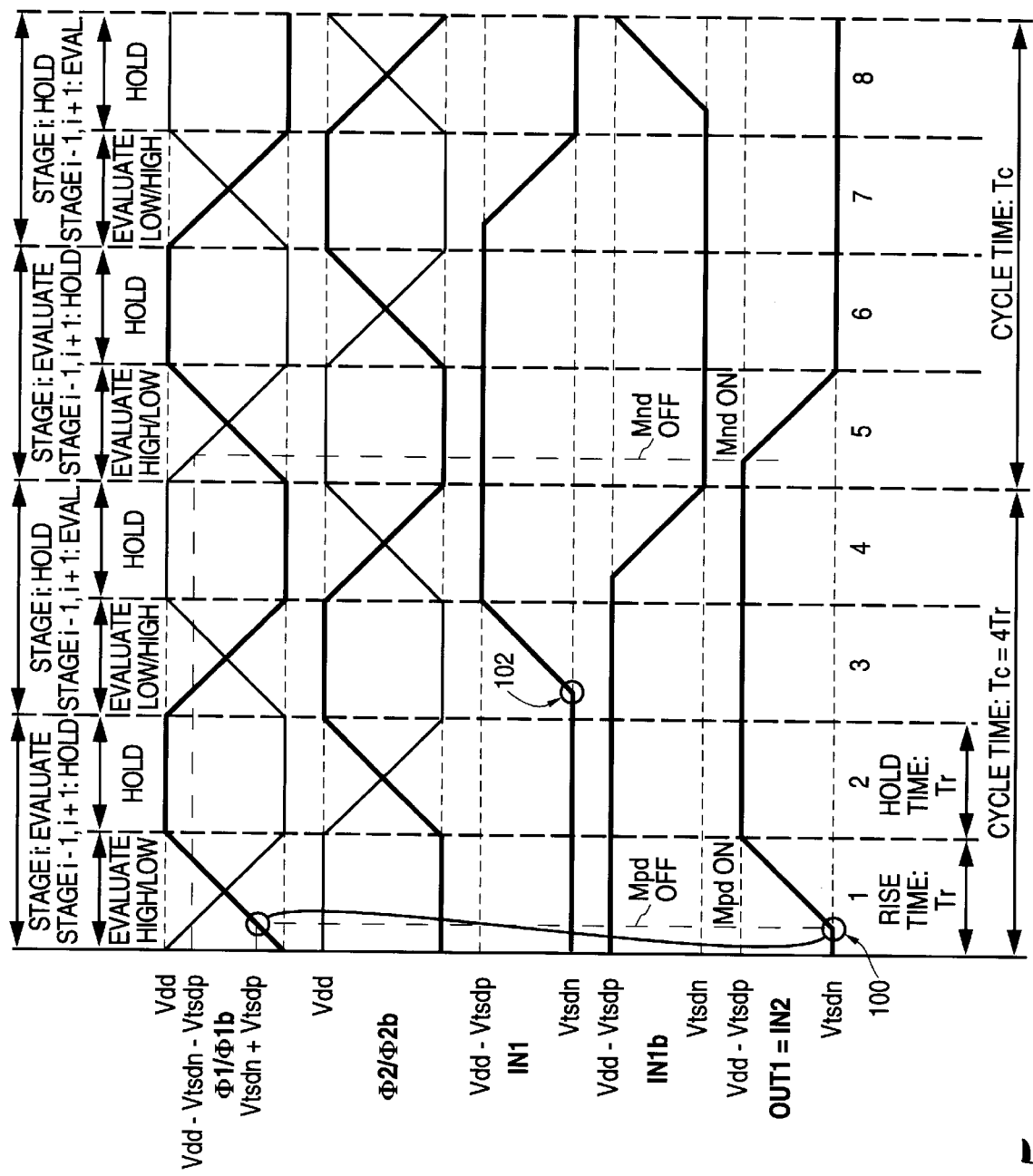
FIG. 5 is a timing diagram illustrating the timing and transitions of various signals in the adiabatic circuit shown in FIG. 2, in which the pull-up and pull-down switch arrangements comprise inverters.

Functioning of the above described cascade 30 of logic stages will now be described with reference to FIGS. 3 and 5. FIG. 5 is a timing diagram illustrating the transitioning of signals within the gate 30 in response to transitions of the input 40, the input complement 42 and the power clock waveforms Ø1, Ø1b, Ø2 and Ø2b. The timing diagram further illustrates operation of an embodiment of the primary gate 30 in which the arrangements of pull-up and pull-down switches 38 and 50 respectively comprise the inverters 44 and 52 illustrated in FIG. 4. An understanding of the functioning of embodiments of the primary gate 30 in which the arrangements 38 and 50 comprises the NAND or NOR gates (or any combination thereof to realize a logic function) will readily be appreciated by those skilled in the art in light of the below description. The operations of various embodiments of other gates 32, 34 and 36 will likewise be understood in light of the below description because of the structural similarities between these various gates.

Referring now specifically to FIG. 5, the operation of the primary gate 30 as it transitions through four stages, during two full clock cycles, is illustrated. Each stage is thus a half cycle in duration, and is either an evaluate stage (in which the gate 30 evaluates the input 40) or a hold stage (in which the gate 30 holds the output 63). Any primary gates preceding or proceeding the gate 30 are at any one time in a stage different from that of the gate 30. For example, if the gate 30 is in a hold stage, then the gate from which it receives the input 40 and the gate 34 are both in an evaluate stage, and visa versa. Each of the two clock cycles is further shown to be divided in four regions (1–4 and 5–8 respectively), each region having a duration of Tr, where Tr is the rise time of the power clock waveforms Ø1 and Ø2. Each of the regions 1–8 is of approximately equal duration, although it will be appreciated that duration of the rise time Tr (regions 1, 3, 5 and 7) need not correspond to the duration of the hold time (regions 2, 4, 6 and 8) for functioning of the illustrated embodiment. The below description will describe the states of the various components, voltages states at various nodes and the movement of charge in the primary gate 30 in each of the regions 1–4.

In region 1, assume that the initial state of the input 40 (labeled as IN1 in FIG. 5) is LOW, and of the input complement 42 (labeled as IN1b) is HIGH. At this time all devices within the gate 30, except the pull-up nMOS switch 44.1, are off. As the pull-up clock waveform Ø1 ramps up from 0 V to Vdd, and the pull-down clock waveform Ø2 ramps down from Vdd to 0 V, a node (mp1), intermediate the arrangement of pull-up switches 38 (i.e. the inverter 44) and the pMOS diode 64, is pulled up through the pull-up nMOS switch 44.1. When the voltage of the node mp1 exceeds Vtsdp+Vtsdn (where Vtsdp is the threshold voltage of the diode 64 and Vtsdn is the zero bias threshold of the nMOS diode 66), the diode 64 turns on, thus causing the output 63 (labeled as OUT1 in FIG. 5) to be pulled up through the diode 64. This event is illustrated at point 100 in FIG. 5. When the pull-up clock waveform Ø1 reaches the voltage Vtsp+Vtsdn (where Vtsp is the threshold voltage of the pull-up pMOS switch 44.2), the pull-up pMOS switch 44.2 switches on. As the voltage of the intermediate node mp1 substantially follows that of the power clock waveform Ø1 in region 1, it will be appreciated that the potential difference across the pMOS switch 44.2 when it switches on is minimal, accordingly satisfying a requirement of adiabatic circuitry. The intermediate node mp1 is thus adiabatically charged to Vdd through both the pull-up nMOS switch 44.1 and pMOS switch 44.2, acting in parallel. Concurrently, the output 63 is adiabatically charged to Vdd–Vtsdp, or HIGH, through the switches 44.1 and 44.2, in series with the pMOS diode 64. As the voltage of the intermediate node mp1 exceeds Vdd–Vtsdp–Vtsn (where Vtsn is the threshold voltage of the pull-up nMOS switch 44.1), the pull-up nMOS switch 44.1 switches off. Again, the potential difference across the switch 44.1 is approximately zero (0) volts at switching. The input 40, and the input complement 42, are respectively held LOW and HIGH, and the pull-down pMOS and nMOS switches 52.1 and 52.2 remain off.

In region 2, the pull-down power clock waveform Ø1b is held LOW (i.e. at Vtsdn). The pull-up power clock waveform Ø1 is held HIGH (i.e. Vdd–Vtsdp), and thus actively drives the output 63 and the intermediate mode mp1 through the pull-up pMOS switch 44.2 and the pMOS diode, both of which are on. As the input 40 and the input complements 42 are maintained LOW and HIGH respectively, the pull-down pMOS and nMOS switches 52.1 and 52.2 remain off. At the end of region 2 (i.e. the first half cycle of clock), the LOW input 40 has accordingly been evaluated, and the output 63 driven HIGH in response to this input. The above regions 1 and 2 can therefore been seen to comprise an evaluate stage of the gate 30, while the stages 3 and 4 described below will be understood to comprise a hold stage.

On commencement of the second half of the clock cycle in region 3, the power clock waveform Ø1 ramps linearly down from Vdd to 0 V, and the intermediate node mp1 is accordingly pull down adiabatically through the pMOS switch 44.2. The pMOS diode 64 prevents charge from the output 63 from following the voltage drop at the intermediate node mp1, and the previously evaluate HIGH value of the output 63 is thus maintained. As Ø1 ramps below Vdd−Vtsdp−Vtsn, the pull-up nMOS switch 44.1 turns on again. For the purposes of illustration, assume that the input 40 is now, as indicated at point 102 in FIG. 5, driven HIGH by an upstream gate (not shown). The pull-up pMOS switch 44.2 remains on until Vp−Vint=Vtsp (where Vp is the voltage at the intermediate node mp1 and Vint is the voltage of the input 40), at which point it switches off.

It will be noted that the transition of the input complement 42 from HIGH to LOW, relative to the transition of the input 40, is delayed by one quarter of a clock cycle (Tr), and that the input complement 42 is accordingly one quarter of a clock cycle out-of-phase with the input 40. This delay is best understood by considering that the input complement 42 is generated by a gate identical in construction to the gate 36 of a pair of associated gates preceding the pair of associated gates 30 and 32 in the cascade of gates pairings. As the gate generating the input complement 42 will accordingly be coupled between power rails 74 and 76, and will thus be responsive to the power clock waveforms Ø2 and Ø2b which are out-of-phase with the power clock waveforms Ø1 and Ø1b by Tr, it follows that the output of such a gate will be delayed relative to the output of an associated primary gate, which generates the input 40 and is responsive to the power clock waveform Ø1.

Since the input complement 42 remains HIGH in region 3, the pull-up nMOS switch 44.1 remains on, and the intermediate node mp1 is adiabatically pulled down to 0 V by the power clock waveform Ø1. As the input 40 lags the power clock waveform Ø1b, the pull-down nMOS switch 52.2 remains off, and the pull-down pMOS switch 52.1 also remains off as the input complement 42 remains HIGH, as described above. The output 63 is thus held HIGH during this region of the hold stage.

Moving on to region 4, the pull-down power clock waveform Ø1b remains at Vdd, and maintains the pull-down nMOS switch 52.2 in an off state. Similarly, the pull-up power clock waveform Ø1 remains at 0 V, thus keeping the pull-up pMOS switch 44.2 off. The preceding complement gate (not shown) now drives the complement input 42 from HIGH to LOW (i.e. Vtsdn). This results in the pull-up nMOS switch 44.1 turning off, and the pull-down pMOS switch 52.1 turning on. The potential differences across the switch 52.1 is again approximately 0 V at the time of switching as Ø1b and the voltage at the intermediate node mn1 are both HIGH. However, the output 63 is not pulled down. This is because, as the pull-down power clock waveform Ø1b is at Vdd, a node mn1 (intermediate the arrangement of pull-down switches 50 and the nMOS diode 66) remains at Vdd and the nMOS diode accordingly remains off, thus maintaining the output 63 HIGH.

Thus, at the end of region 4 and the first clock cycle, the gate 30 is again ready to evaluate the changed state of input 40, which transitioned from LOW to HIGH in region 3. This evaluation is done in manner analogous to the manner in which the evaluation was performed in regions 1 and 2.

Accordingly, an adiabatic circuit arrangement within which a logic family can be constructed, and the manner of operation of such a circuit arrangement, have been described above. As will have been noted from the description, the switching of pMOS and nMOS switches within the pull-up and pull-down switch arrangements occurs when the potential difference across these switches are low, and at approximately 0 V, thus preventing a flood of charge across the switches, and avoiding a resultant high energy dissipation due to the resistive natures of such switches. The present invention is advantageous in that this characteristic is achieved with only four power clock waveforms (Ø1, Ø1b, Ø2 and Ø2b), and with a limited number of switching devices.

Figure 6:
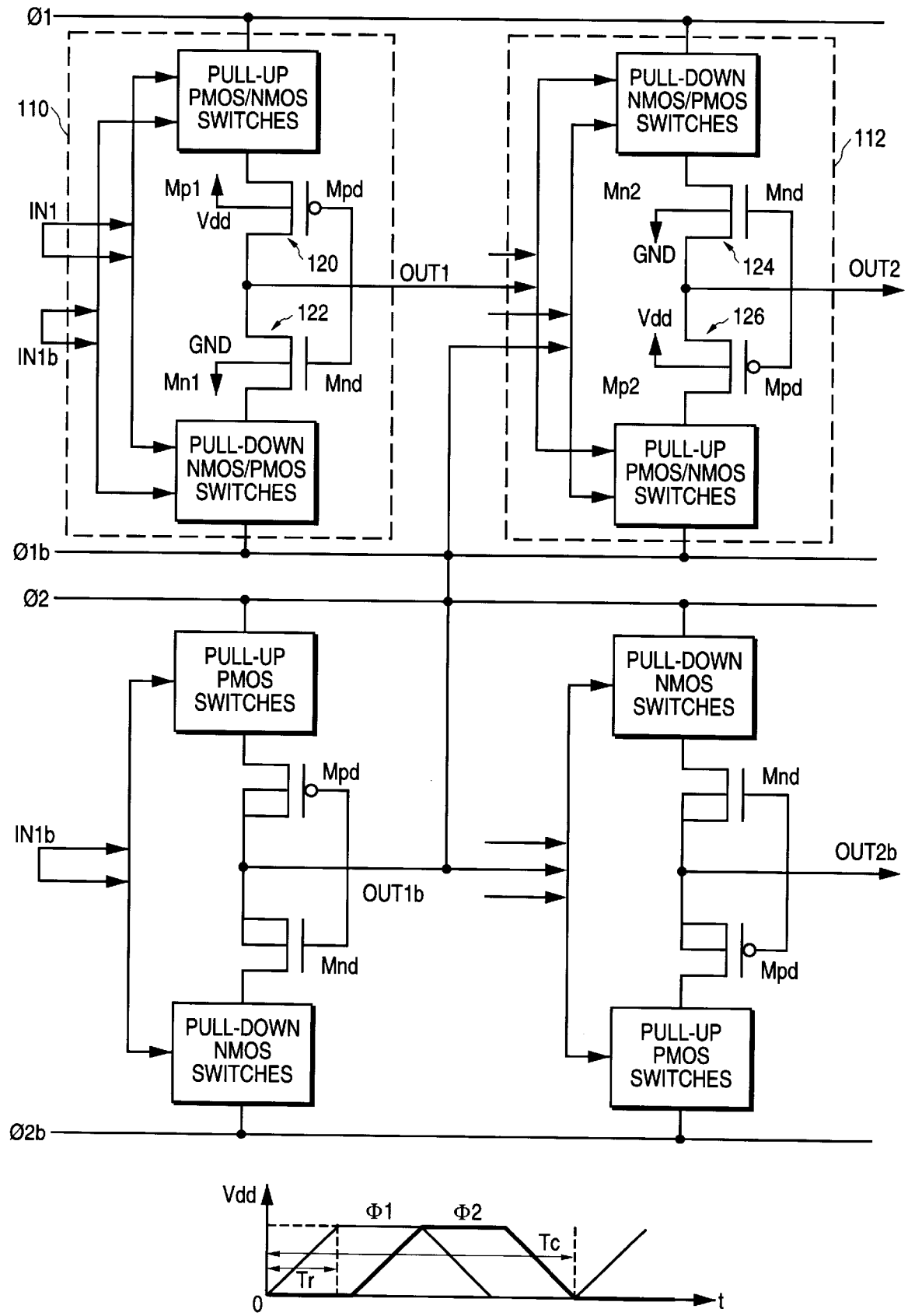
FIG. 6 is a circuit diagram illustrating a further embodiment of an adiabatic circuit according to the invention.
Figure 7:
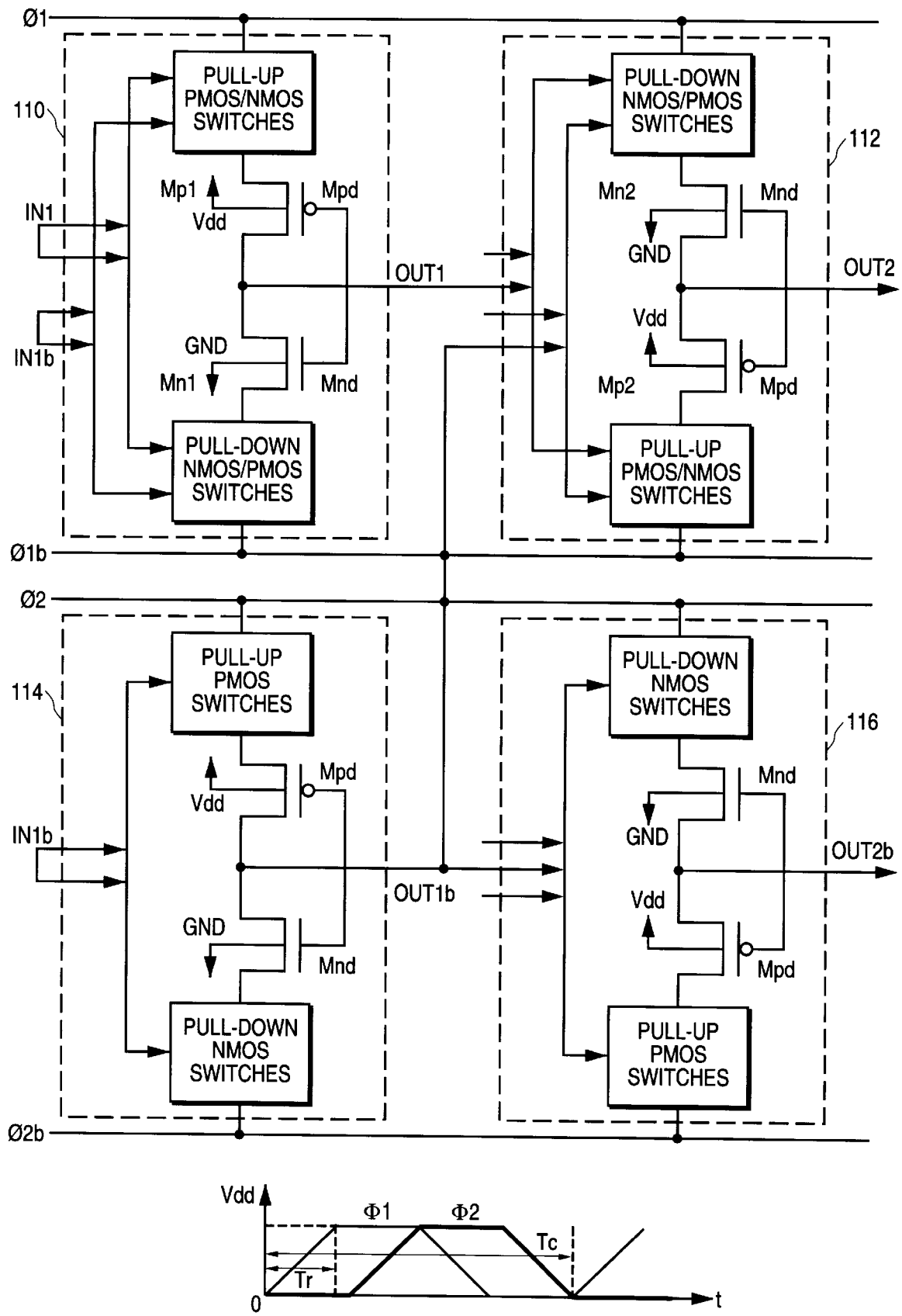
FIG. 7 is a circuit diagram illustrating yet a further embodiment of an adiabatic circuit according to the invention.

FIGS. 6 and 7 show alternate embodiments of the present invention, in which the construction of the holding circuitries differs from the embodiment illustrated in FIG. 2. Specifically, with reference to FIG. 6, it will be noted that, in the primary gate 110, the body of the pMOS diode 120 is coupled to a DC power source Vdd and that the body of the nMOS diode 122 is coupled to ground. Similarly, in the primary gate 112, the body of the nMOS diode 124 is coupled to ground and the body of the pMOS diode is coupled to Vdd. This arrangement results in a larger power dissipation as charge traverses the diodes that in the gates illustrated in FIG. 2, but may nonetheless be desirable to implement for cost reasons. FIG. 7 shows an embodiment in which the bodies the pMOS and nMOS diodes of the secondary gates 114 and 116 are also coupled to ground and Vdd, as described above with reference to FIG. 6.

Although the present invention has been described with reference to specific exemplary embodiments, it will be evident that various modifications and changes may be made to these embodiments without departing from the broader spirit and scope of the invention. Specifically, the above description has described the switching devices implemented using nMOS and pMOS MOSFETS in bulk Si or SOI. It will readily be appreciated that the teachings of the present invention could be implemented utilizing complementary, three-terminal FET-like switching devices such as MOSFETS or HEMTs. Accordingly, the specification and drawings are to be regarded in an illustrative rather than a restrictive sense.

What is claimed is:

1. A lower power dissipation gate for use in a logic cascade, the gate comprising:
   a pull-up switch arrangement that outputs a first logic signal which is a function of the pull-up switch arrangement, the pull-up switch arrangement comprising a first P-type switching device and a first N-type switching device, the first P-type switching device being coupled to receive a first input signal and the first N-type switching device being coupled to receive a second input signal which is the complement of the first input signal, and both the first P- and N-type switching devices being coupled to receive a first power clock waveform; and
   a pull-down switch arrangement that outputs a second logic signal which is a function of the pull-down switch arrangement, the pull-down switch arrangement comprising a second N-type switching device and a second P-type switching device, the second N-type switching device being coupled to receive the first input signal and the second P-type device being coupled to receive the second input signal, and both the second N- and P-type switching devices being coupled to receive a second power clock waveform.

2. The gate of claim 1 including hold circuitry coupled to receive the first and second logic signals outputted from the pull-up and pull-down switch arrangements respectively, and to hold and output one of the first or second logic signals to a downstream gate.

3. The gate of claim 1 wherein the P- and N-type switching devices comprise pMOS and nMOS switches respectively.

4. The gate of claim 1 wherein the first and second power clock waveforms are out-of-phase by a predetermined amount.

5. The gate of claim 4 wherein the first and second power clock waveforms are out-of-phase by approximately 180 degrees.

6. The gate of claim 1 wherein a transition of the first input signal is out-of-phase with a transition of the second input signal by a predetermined amount.

7. The gate of claim 6 wherein the transition of the first input signal is out-of-phase with the transition of the second input signal by one quarter of a cycle of the first power clock waveform.

8. The gate of claim 2 wherein the hold circuitry comprises first and second diodes coupled between outputs of the pull-up and pull-down switch arrangements.

9. The gate of claim 8 wherein the first diode comprises a P-type switching device, and the second diode comprises a N-type switching device.

10. The gate of claim 1 wherein the pull-up switch arrangement comprises an inverter.

11. The gate of claim 1 wherein the pull-up switch arrangement comprises a NAND circuit.

12. The gate of claim 1 wherein the pull-up switch arrangement comprises a NOR circuit.

13. A circuit arrangement for use in a cascade of logic stages, the circuit arrangement comprising:

first and second power rails that respectively carry first and second power clock waveforms;

a first gate that provides a first output signal in response to a first input signal, the first gate including a first arrangement of pull-up switches and a first arrangement of pull-down switches, wherein the first arrangement of pull-up switches is coupled to the first power rail to receive the first power clock waveform, and the first arrangement of pull-down switches is coupled to the second power rail to receive the second power clock waveform;

a second gate that provides a second output in response to the first output of the first gate, the second gate including a second arrangement of pull-up switches and a second arrangement of pull-down switches, wherein the second arrangement of pull-up switches is coupled to the second power rail to receive the second power clock waveform, and the second arrangement of pull-down switches is coupled to the first power rail to receive the first power clock waveform; and a third gate that provides a third output signal which is the complement of the first output signal, the second gate being coupled to receive the first and third output signals from the first and third gates respectively.

14. The circuit arrangement of claim 13 wherein the first and second power clock waveforms are approximately 180 degrees out-of-phase.

15. The circuit arrangement of claim 13 wherein the second arrangement of pull-down switches comprises a fourth P-type switching device coupled to receive the third output signal from the third gate and a fourth N-type switching device coupled to receive the first output signal from the first gate.

16. The circuit arrangement of claim 13 including third and fourth power rails for carrying third and fourth power clock waveforms, and wherein the third gate is coupled between the third and fourth power rails, and wherein the third power clock waveform is out-of-phase with the first power clock waveform.

17. The circuit arrangement of claim 16 wherein the third and fourth power clock waveforms are approximately 180 degrees out-of-phase.

18. The circuit arrangement of claim 13 wherein the first arrangement of pull-up switches comprises a first P-type switching device coupled to receive the first input signal and a first N-type switching device coupled to receive a second input signal, wherein the second input signal is the complement of the first input signal.

19. The circuit arrangement of claim 18 wherein the first arrangement of pull-down switches comprises a second P-type switching device to receive the second input signal and a second N-type switching device coupled to receive the first input signal.

20. The circuit arrangement of claim 13 wherein the second arrangement of pull-up switches comprises a third P-type switching device coupled to receive the first output signal from the first gate and a third N-type switching device coupled to receive the third output signal from the third gate.

21. A method of switching a gate in a logic cascade, wherein the gate includes a pull-switch arrangement configured to output a first logic signal, the method comprising the steps of:

supplying a first power clock waveform, a first input signal and a second input signal to the pull-up switch arrangement, wherein the second input signal is the complement of the first input signal;

switching a P-type switching device within the pull-up switch arrangement responsive to the first input signal and the first power clock waveform; and switching a N-type switching device within the pull-up switch arrangement responsive to the second input signal and the first power clock waveform.

22. The method of claim 21 wherein the gate includes a pull-down switch arrangement configured to output a second logic signal, the method including the steps of:

supplying a second power clock waveform, the first input signal and the second input signal to the pull-down switch arrangement;

switching a P-type switching device within the pull-down switch arrangement responsive to the second input signal and the second power clock waveform; and switching a N-type switching device within the pull-up switch arrangement responsive to the first input signal and the second power clock waveform.

23. The method of claim 22 wherein the first and second power clock waveform are out-of-phase by approximately 180 degrees.

24. The method of claim 21 wherein respective transitions of the first and second input signals are out-of-phase by a predetermined amount.

25. The method of claim 24 wherein a transition of the second input signal is delayed relative to a transition of the first input signal by the predetermined amount.

26. The method of claim 25 wherein the transition of the second input signal is delayed relative to the transition of the first input signal by one quarter of a cycle of the first power clock waveform.

* * * * *

UNITED STATES PATENT AND TRADEMARK OFFICE
CERTIFICATE OF CORRECTION

PATENT NO.   : 5,841,299
DATED        : November 24, 1998
INVENTOR(S)  : De

It is certified that error appears in the above-identified patent and that said Letters Patent is hereby corrected as shown below:

Column 5,
Line 39, delete "provides" and insert -- provide --.

Column 12,
Line 18, after "device", insert -- coupled --.

Signed and Sealed this

Twelfth Day of August, 2003

JAMES E. ROGAN
*Director of the United States Patent and Trademark Office*